United States Patent [19]
Kato et al.

[11] Patent Number: 4,709,243
[45] Date of Patent: Nov. 24, 1987

[54] THERMAL HEAD AND METHOD FOR MANUFACTURE THEREOF

[75] Inventors: Masakazu Kato; Takehiro Takoshima, both of Furukawa, Japan

[73] Assignee: Alps Electric Co., Ltd., Japan

[21] Appl. No.: 790,415

[22] Filed: Oct. 23, 1985

[30] Foreign Application Priority Data

Oct. 23, 1984 [JP] Japan ................................ 59-221244

[51] Int. Cl.⁴ ............................................. G01D 15/10
[52] U.S. Cl. .................................. 346/76 PH; 219/543
[58] Field of Search ............ 346/76 PH, 76 R, 139 C; 219/216 PH, 543; 428/936; 400/120; 338/308, 309, 314; 252/520

[56] References Cited
U.S. PATENT DOCUMENTS 4,232,213  11/1980  Taguchi et al. ..................... 219/543

OTHER PUBLICATIONS

Materials Handbook by Brady, Aug. 2, 1966, p. 677.

Primary Examiner—Arthur G. Evans
Attorney, Agent, or Firm—Guy W. Shoup

[57] ABSTRACT

A thermal head having a heat-generating resistor layer, a power feeding conductor layer, and a protective layer superposed on an electrically insulating layer, acquires improved quality by forming the heat-generating resistor layer with an alloy consisting of tantalum, a high-melting metal, and nitrogen. The thermal head of improved quality is produced by spattering a composite target consisting of tantalum and the high-melting metal in a mixed gas consisting of nitrogen and argon.

The high-melting metal is at least one member selected from the group consisting of titanium, zirconium, hafnium, vanadium, niobium, chromium, molybdenum, and tungsten.

4 Claims, 8 Drawing Figures

THERMAL HEAD AND METHOD FOR MANUFACTURE THEREOF

BACKGROUND OF THE INVENTION

1. Field of the Invention

This invention relates to a thermal head and to a method for the manufacture thereof, and more particularly to a heat-generating heat resistor layer used in the thermal head.

2. Description of the Prior Art

Generally the thermal head has a heat-generating resistor layer for forming heat-generating dots, a power feeding conductor layer for feeding electricity to the heat-generating resistor layer, and a protective layer for protection against oxidation and wear superposed sequentially on an electrically insulating substrate such as a ceramic sheet coated with a thin glass layer.

Heretofore, a film of tnatalum nitride has been used as the heat-generating resistor layer mentioned above. The tantalum nitride film has the advantage that it excels in thermal resistance, possesses a small temperature coefficient, and adheres tightly with an underlying glass layer.

The film of tantalum nitride is formed by spattering a tantaoum target in a mixed gas consisting of argon gas and a minute amount of nitrogen gas. Even when the nitrogen gas content of the mixed gas is varied more or less during the course of this production, the specific resistance and the temperature coefficient of the produced tantalum nitride film are affected nominally. The presence of the so-called "plateau region" constitutes a major feature of this film. Thus, the conditions of production are easy to control. It is a film resistor material ideal for mass production.

Then, in the pattern formation, the film can be easily etched with a mixed acid consisting of nitric acid and hydrofluoric acid. It can otherwise be dry etched with the $CF_4$ gas, for example. This ease of fabrication forms one reason for popular acceptance found by the tantalum nitride film.

When the tantalum nitride film is used as the heat-generating resistor in the thermal head, since it offers no sufficient resistance to thermal oxidation, there has existed an established practice of coating the surface of the tantalum nitride film with an anti-oxidant protective film made of silicon oxide. Since the tantalum nitride film and the silicon oxide film adhere to each other with extremely high intimacy, the coating with the silicon oxide film amply enhances the resistance of the tantalum nitride film to thermal oxidation.

Recent years have witnessed proposal of various heat-generating resistor materials highly stable to withstand thermal oxidation. Some of them entail production conditions difficult to control and others exhibit poor processability as by etching. Thus, very few of them have been adopted for actual use. The aforementioned advantage in terms of production is believed to form one major cause for the conventional widespread adoption of the tantalum nitride film as the heat-generating resistor material.

The use of the tantalum nitride film as the heat-generating resistor in the thermal head is not entirely free from any shortcoming. The problem encountered in this case will be described below.

The curve A of FIG. 1 represents the results of the step-stress test performed on a thermal head using the tantalum nitride film as a heat-generating resistor as heretofore practiced. This is one type of accelerated test generally used in evaluating the thermal stability of a thermal head. This test is carried out by applying a proper pulse voltage to the heat-generating resistor for a prescribed period while measuring a change in the magnitude of initial voltage, repeating the application of pulse voltage while increasing the magnitude of applied pulse voltage stepwise until the heat-generating resistor burns out, and plotting the ratios of change in the magnitude of resistance at the successive steps.

The conditions of the step-stress test are as follows. In the first step, application of a pulse voltage of 7.0 V for 1 m.second is continued in cycles of 20 m.seconds over a total period of 10 minutes. At the end of the first step, the magnitude of resistance is measured. In the second step, the application of a pulse voltage now raised to 7.5 V is continued under the same conditions as in the first step. In the subsequent steps, the application of a pulse voltage successively raised by a unit increment of 0.5 V per step is continued. This voltage application is repeated until the ratio of change in the magnitude of resistance, $\Delta R/R$, rises past 10%.

The upper horizontal axis of FIG. 1 is a scale for the highest temperature of the surface of the heat generator under varying magnitudes of applied voltage. This temperature is measured with an infrared spot thermometer.

In the thermal head using the conventional heat-generating resistor formed of a tantalum nitride film, the magnitude of resistance of the heat-generating resistor begins to decrease when the applied power is about 22 $W/mm^2$ and the surface temperature of the heat generator is about 400° C. as indicated by the curve A. Incidentally in the ordinary thermal printer, the surface temperature of the heat generator required for heat generation of the thermosensitive paper is about 350° to 400° C. As the printing speed is increased, the surface temperature of the heat generator is required to be proportionately increased, past 500° C., for example. When the thermal head using the heat-generating resistor of the conventional tantalum nitride is used in printing, the density of the prints produced gradually increases with elapse of printing time. At times, the quality of prints is inferior because of smearing, blurring, etc.

This drawback is ascribable to the aforementioned decrease in the magnitude of resistance of the heat-generating resistor of tantalum nitride at elevated temperatures. Generally, the voltage applied to the thermal head is constant and the magnitude of resistance of the heat-generating resistor of tantalum nitride continues to decrease. Thus, the electric power supplied for heat generation sharply increases relatively and, as the result, the surface temperature of the heat generator is excessively elevated. In this manner, the surface temperature rises past the optimum color-producing temperature of the photosensitive paper to entail the degradation of the quality of print due to smearing, for example. Since the elevated temperature is much higher than the temperature normally required, it burns out the heat-generating resistor and renders it useless.

An object of this invention is to provide a thermal head free from the aforementioned drawbacks suffered by the conventional countertype and capable of producing prints of high quality and a method for the manufacture of this thermal head.

SUMMARY OF THE INVENTION

The present invention is characterized by using a heat-generating resistor which is formed of a film of an alloy consisting of tantalum, a high-melting metal, and nitrogen.

Further this invention is characterized by producing a heat-generating resistor formed of a film of an alloy consisting of tantalum, a high-melting metal, and nitrogen by spattering a composite target consisting of tantalum and a high-melting metal in a mixed gas consisting of nitrogen and argon.

The high-melting metal to be used in this invention is at least one metal selected from the group consisting of titanium, zirconium, hafnium, vanadium, niobium, chromium, molybdenum, and tungsten.

The other objects and characteristic features of the present invention will become apparent to those skilled in the art as the disclosure is made in the following description of a preferred embodiment of the invention, with reference to the accompanying drawings.

DESCRIPTION OF PREFERRED EMBODIMENT

Figures 2, 3:
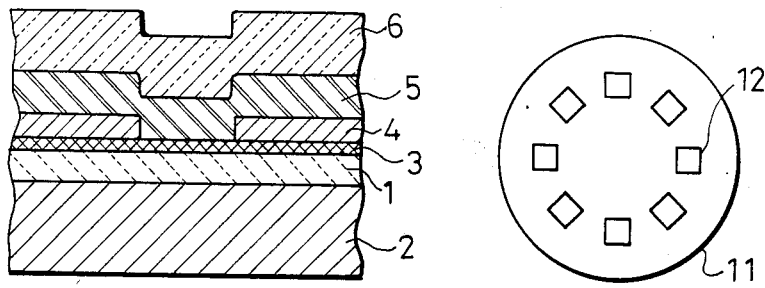
FIG. 2 is a cross-sectional diagram illustrating a thermal head as one embodiment of this invention.
FIG. 3 is a plan view of a spattering target to be used in the process for the manufacture of this invention.

FIG. 2 is a cross-sectional diagram of a heat generator in a thermal head according with the present invention. On an insulating substrate 2 of ceramic coated with a thin glaze layer 1 about 50 $\mu$m in thickness, a heat-generating resistor layer 3 formed of an alloy consisting of tantalum and a high-melting metal according with this invention is superposed. The thickness of the heat-generating resistor layer 3 is about 0.05 to 0.2 $\mu$m.

Then, a power feeding conductor layer 4 formed of aluminum in a thickness of 1 to 2 $\mu$m is formed thereon. The aforementioned heat-generating resistor layer 3 and the conductor layer 4 are sequentially photo-etched to give rise to a pattern required of a thermal head. Subsequently, an antioxidant protective layer 5 formed of silicon oxide in a thickness of 2 $\mu$m and a wear-resistant protective layer 6 formed of tantalum pxide in a thickness of several $\mu$m are sequentially sueprposed thereon to complete a thermal head.

Now, the method adopted for the manufacture of the heat-generating resistor will be described. For the formation of the heat-generating resistor of the present invention, the spattering technique is employed. FIG. 3 is a plan view illustrating the construction of a target to be used in the spattering.

On the upper surface of a tantalum target 11 of the shape of a disk, chips of a high-melting metal having a surface area of a square of 10 mm and a thickness of 1 to 2 mm are deposited. By changing the number of these chips 12, the high-melting metal content in the alloy film to be finally produced can be adjusted. By using the resultant composite target and keeping a clean glazed alumina substrate at an elevated temperature in the range of 100° to 300° C., spattering is effected with a high-frequency magnetron under the atmosphere of a mixed gas consisting of argon gas a partial pressure of 0.2 to 0.9 Pa ($1.5 \times 10^{-3}$ to $7.0 \times 10^{-3}$ Torr) and nitrogen gas of a partial pressure of 0.01 to 0.05 Pa ($7.5 \times 10^{-6}$ to $4.0 \times 10^{-4}$ Torr), to form a film consisting of tantalum and a high-melting metal according with the present invention. During the course of this spattering, the high-frequency input power is 8 to 20 W/cm$^2$ per unit area of the target. When the input power is 3.9 W/cm$^2$, the film-forming speed is about 160 Å/minute, although this value is variable more or less with the kind and volume of the high-melting metal to be used.

In the thermal head using the heat-generating resistor of the present invention, no decrease occurs in the magnitude of resistance of the heat-generating resistor until the surface temperature of the heat generator reaches about 700° C. Since the heat-generating resistor possesses such thermal stability, the thermal head does not suffer degradation of the quality of print even after a protracted use. The effect in terms of performance has been described. In terms of production, no noticeable difficulty is encountered in the control of production conditions during the step of film forming and the step of etching. This heat-generating resistor can be obtained with substantially the same ease as the conventional tantalum nitride film. The method, therefore, suits mass production.

Figure 4:
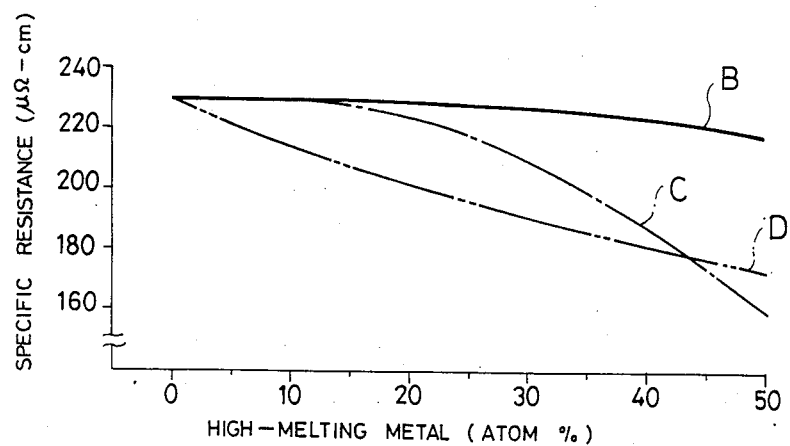
FIG. 4 is a characteristic diagram showing the relation between the content of high-melting metal and the specific resistance of a thin-film resistor.

FIG. 4 is a graph showing the relation between the high-melting metal content (the radio of high-melting metal/(tantalum + high-melting metal) expressed in atom %) and the specific resistance found in the aforementioned spattering operation conducted with the partial pressure of argon gas fixed at 0.6 Pa ($4.5 \times 10^{-3}$ Torr), the partial pressure of nitrogen gas fixed at 0.015 Pa ($1.1 \times 10^{-4}$ Torr), the substrate temperature fixed at 200° C., and the high-frequency input power fixed at 3.9 W/cm$^2$ respectively. When the high-melting metal content is 0 atom %, the produced film equals the conventional tantalum nitride film.

Figure 5:
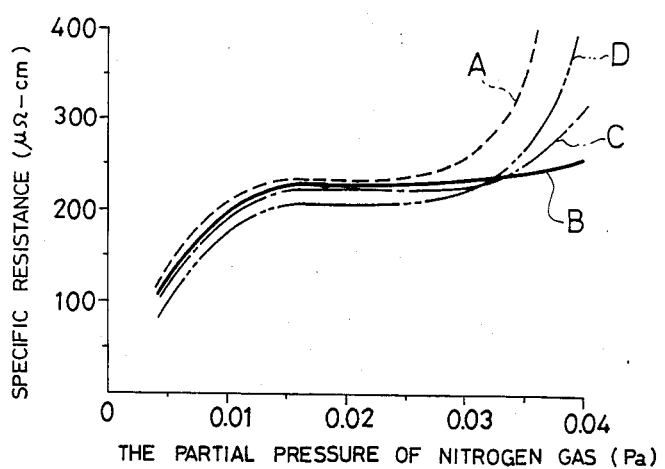
FIG. 5 is a characteristic diagram showing the relation between the partial pressure of nitrogen gas and the specific resistance of a thin-film resistor during the spattering operation.

FIG. 5 is a graph showing the relation between the partial pressure of nitrogen gas and the specific resistance of the alloy film under the aforementioned spattering conditions.

In FIG. 1, FIG. 4, FIG. 5, and FIG. 8, the curves A represent the characteristic curves of the conventional tantalum nitride, the curves B those of a tantalum-tungsten-nitrogen type alloy (Sample B), the curves C those of a tantalum-chromium-nitrogen type alloy (Sample C), and the curves D those of a tantalum-molybdenum-nitrogen type alloy (Sample D).

Now, the properties of the tantalum-high-melting metal-nitrogen type alloys (Samples B-D) according with the present invention will be described.

(Sample B)

It is noted from FIG. 4 and FIG. 5 that the specific resistance is substantially constant despite variation in the tungsten content and the region in which the specific resistance is substantially constant in spite of variation in the partial pressure of nitrogen (plateau region) is wider than in the case of the conventional tantalum nitride, indicating that the spattering conditions can be controlled more easily than tantalum nitride.

A tantalum-tungsten-nitrogen type alloy film having a tungsten content of 22 atom % was prepared under the aforementioned spattering conditions and a thermal head using the resultant alloy film as the heat-generating resistor was subjected to the step-stress test. The results are indicated by the curve B in FIG. 1. It is noted from the graph that the temperature at which the decrease in the magnitude of resistance begins is about 700° C., a level about 300° C. higher than the level of the conventional tantalum nitride film (curve A). Thus, the film enjoys extremely high thermal stability.

The aforementioned decrease in the magnitude of resistance is generally referred to as the "aneal effect" of a thermal head. The film formed as by spattering is considered to retain the state of sub-equilibrium because of a relatively high potential energy of the component atoms thereof. As this film is heated, the thermal energy decreases the potential energy of the component atoms of the film and consequently causes the film to shift from the state of sub-equilibrium to the state of equilibrium. The aforementioned decrease in the magnitude of resistance is believed to be a microscopic effect observed during this process.

Figure 6:
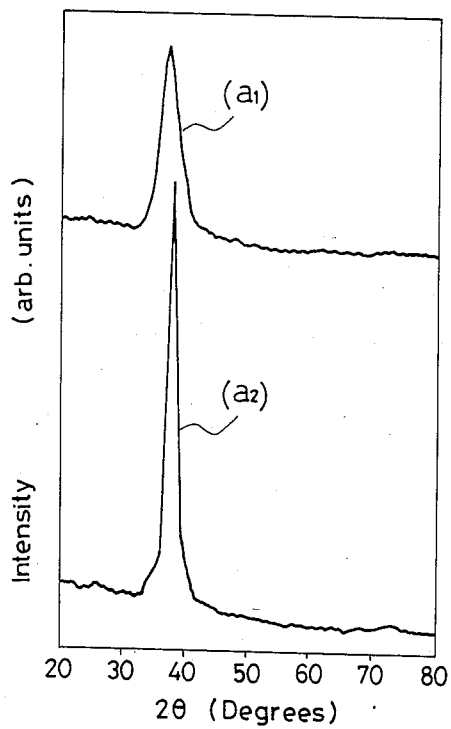
FIG. 6 is an X-ray diffraction diagram of tantalum nitride.

On the other hand, as a microscopic effect, the so-called recrystallization, a phenomenon of the improvement of crystallinity of the film, is believed to ensue. FIG. 6 is an X-ray diffraction diagram of the conventional tantalum nitride film. In this graph, the curve ($a_2$) represents the data obtained of the film as formed and the curve ($a_3$) those obtained of the film left aging in a vacuum (vacuum degree of 0.02 Pa; the same applying invariably hereinafter) at 500° C. for one hour. The X-ray diffraction forms one of the effective means of evaluating the crystallinity of a substance. The curve ($a_3$) has a higher peak and a smaller half-value width than the curve ($a_2$), clearly indicating that the thermal treatment provides a notable improvement in crystallinity. It is seen that at 500° C., the recrystallization of the tantalum nitride film has advanced to a fair extent. This observation justifies a statement that the temperature of the recrystallization is below 500° C.

Figure 1:
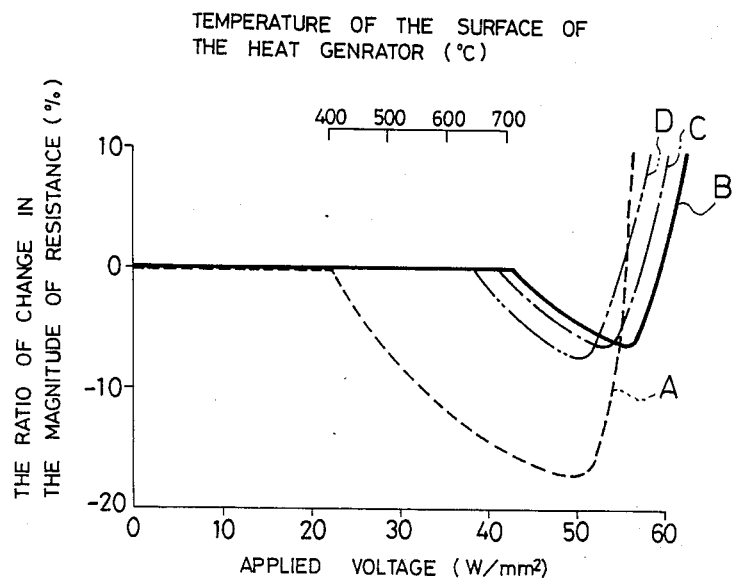
FIG. 1 is a characteristic diagram showing the results of the step-stress test performed on thermal heads.

Comparison of the data with the curve A, the results of the step-stress test, of FIG. 1 reveals that at the surface temperature, 500° C., of the heat generator, there occurs a decrease of about $-7\%$ in the magnitude of resistance. Microscopically, this decrease manifests itself in the form of progress of the recrystallization of the tantalum nitride film. It is, therefore, logical to conclude that the temperature of crystallization of the tantalum nitride film is about 400° C.

Figure 7:
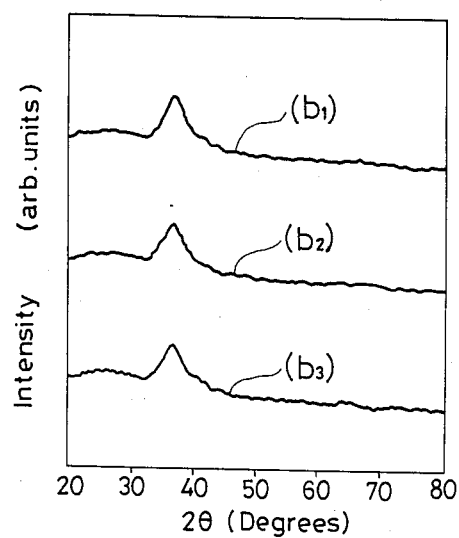
FIG. 7 is an X-ray diffraction daigram of a heat-generating resistor as one embodiment of this invention.

FIG. 7 is an X-ray diffraction diagram of the tantalum-tungsten-nitrogen type alloy film according with the present invention. In the graph, the curve ($b_2$) represents the data obtained of the film as formed and the curve ($b_3$) those of the film heated in a vacuum for one hour each at 500° C. and 600° C. It is noted from this graph that the curves ($b_2$) and ($b_3$) show virtually no change as compared with the curve ($b_1$). Thus, it is logical to conclude that the temperature of recrystallization of the film is not less than about 600° C.

Figure 8:
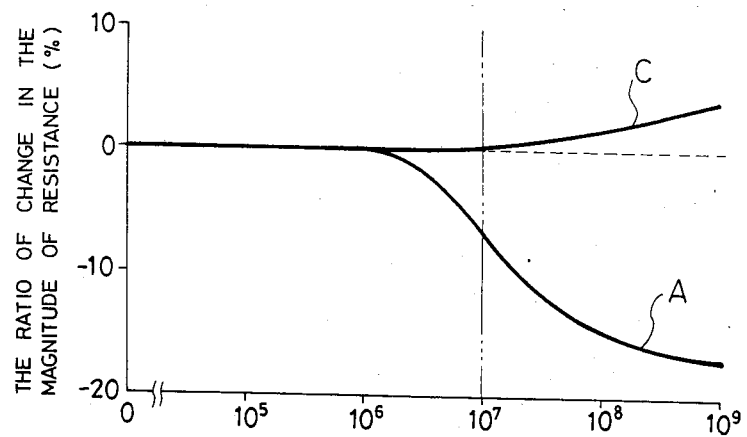
FIG. 8 is a characteristic diagram illustrating the results of the pulse life test.

FIG. 8 is a graph showing the results of a pulse life test. This test comprises apolying a pulse of a width of 1.5 m.seconds and a cycle of 5.4 m.seconds at a voltage of 25 W/mm² continuously to a thermal head thereby heating the heat-generating resistor thereof electrically and evaluating the service life of the thermal head based on the variation in the magnitude of resistance of the heat-generating resistor.

It is noted from the graph that in the case of the conventional tantalum nitride film (curve A), the magnitude of resistance is 17% less than the initial magnitude after application of a total of $10^9$ pulses. In view of the variation in the density of print, the allowable variation in the magnitude of resistance is $\pm 10\%$. In the present case, therefore, the total of $2 \times 10^7$ pulses which brings about a change of $-10\%$ forms the service life of the conventional thermal head. In contrast, in the case of the tantalum-chromium-nitrogen type alloy film according with the present invention (curve C), the variation in the magnitude of resistance is only about 4% even after application of a total of about $10^9$ pulses. This means that the alloy film ensures production of a thermal head of a long pulse life. Thus, the addition of chromium is highly effective in improving thermal stability and elongating service life as well.

(Sample D)

The curves D in FIG. 4 and FIG. 5 represent the characteristic curves of a tantalum-molybdenum-nitrogen type alloy film. It is noted from these curves that the magnitude of specific resistance gradually decreases with the increasing molybdenum content but that this decrease is too slight to pose any hindrance to the practical use of the film. Owing to the presence of the plateau region, the spattering conditions are easy to control. A tantalum-molybdenum-nitrogen type alloy film having a molybdenum content of 20 atom % was prepared under the aforementioned spattering conditions and a thermal head using this alloy film as the heat-generating resistor thereof was subjected to the step-stress test. The results of this test are indicated by the curve D of FIG. 1.

In this case, substantially similarly to the preceding cases, the temperatue at which the anneal effect begins to manifest is about 650° C., a level about 250° C. higher than the level for the conventional tantalum nitride film. Thus, the alloy film enjoys notable enhancement of thermal stability.

As described in the working examples cited above, the heat-generating resistors formed of the tantalum-tungsten-nitrogen type alloy film, the tantalum-chromium-nitrogen type alloy film, and the tantalum-molybdenum-nitrogen type alloy film enjoy improvement in thermal stability. It has been experimentally demonstrated that this improvement is otherwise obtained by using as the high-melting metal one member selected from the group consisting of titanium, zirconium, hafnium, vanadium, and niobium, or by using a combination of two or more members selected from the group consisting of tungsten, chromium, molybdenum, titanium, zirconium, hafnium, vanadium, and niobium.

The range of alloy compositions recommendable for the heat-generating resistor of the present invention are shown in the following table

TABLE

| High-melting metal (atom %) | | Ta (atom %) | N (atom %) |
|---|---|---|---|
| W | 10 ~ 40 | 30 ~ 70 | 10 ~ 40 |
| Cr, Mo | 10 ~ 50 | 30 ~ 80 | 10 ~ 40 |
| Zr, Hf | 5 ~ 30 | 20 ~ 60 | 20 ~ 50 |
| Ti | 5 ~ 30 | 10 ~ 50 | 30 ~ 60 |

TABLE-continued

| High-melting metal (atom %) | Ta (atom %) | N (atom %) |
| --- | --- | --- |
| V, Nb   20 ~ 60 | 10 ~ 50 | 20 ~ 50 |

When the film resistors having alloy compositions falling within the ranges shown in the preceding table are used in thermal heads, they do not manifest the anneal effect until the surface temperatures of the heat generators rise past 600° C.

Further, the heat-generating resistor of the present invention enjoys ease of fabrication. Particularly the etching can be effected easily with a mixed acid consisting of nitric acid and hydrofluoric acid in much the same way as the conventional tantalum nitride film. This fact constitutes a salient feature in terms of production.

The alloy film according with the present invention has a high temperature of recrystallization. The thermal head using this alloy film as the heat-generating resistor, therefore, enjoys outstanding thermal stability because it shows absolutely no decrease in the magnitude of resistance until the surface temperature of the heat generator rises to the level of about 700° C. The thermal head, accordingly, is capable of producing prints of high quality through a protracted service.

Moreover, the alloy film of the present invention enjoys ease of fabrication during the step of film forming and the step of etching and, therefore, is favorably comparable with the conventional tantalum nitride in terms of production.

What is claimed is:

1. A thermal head having a heat-generating resistor layer, a power feeding conductor layer, and a protective layer superposed on an electrically insulating layer, characterized by the fact that said heat-generating resistor layer is formed of ternary alloy consisting of tantalum, a high-melting metal, and nitrogen.

2. A thermal head according to claim 1, wherein said high-melting metal is at least one metal selected from the group consisting of titanium, zirconium, halnium, vanadium, niobium, chromium, molybdenum, and tungsten.

3. A thermal head according to claim 1, wherein the content of tantalum is controlled in the range of 10 to 80 atom %, the content of said high-melting metal in the range of 5 to 60 atom %, and the content of nitrogen in the range of 10 to 60 atom % respectively.

4. A thermal head according to claim 2, wherein the content of tantalum is controlled in the range of 10 to 80 atom %, the content of said high-melting metal in the range of 5 to 60 atom %, and the content of nitrogen in the range of 10 to 60 atom % respectively.

* * * * *